(12) United States Patent
Inomata

(10) Patent No.: US 8,536,694 B2
(45) Date of Patent: Sep. 17, 2013

(54) SEMICONDUCTOR DEVICE

(75) Inventor: Daisuke Inomata, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 337 days.

(21) Appl. No.: 12/805,555

(22) Filed: Aug. 5, 2010

(65) Prior Publication Data

US 2011/0031615 A1    Feb. 10, 2011

(30) Foreign Application Priority Data

Aug. 7, 2009   (JP) ................................. 2009-184757

(51) Int. Cl.
H01L 27/00    (2006.01)

(52) U.S. Cl.
USPC .... 257/690; 257/687; 257/730; 257/E33.056; 257/E23.001; 257/E21.499

(58) Field of Classification Search
USPC .................. 257/687, 730, E33.056, E23.001, 257/E21.499
See application file for complete search history.

(56) References Cited

U.S. PATENT DOCUMENTS

| | | | |
|---|---|---|---|
| 7,250,354 B2 * | 7/2007 | Uchida | 438/460 |
| 7,253,027 B2 * | 8/2007 | Kanakubo | 438/113 |
| 7,714,448 B2 * | 5/2010 | Miyata et al. | 257/778 |
| 7,728,438 B2 * | 6/2010 | Kameyama et al. | 257/774 |
| 7,847,388 B2 * | 12/2010 | Takahashi | 257/686 |
| 7,863,745 B2 * | 1/2011 | Nomoto et al. | 257/758 |
| 7,919,875 B2 * | 4/2011 | Noma et al. | 257/783 |
| 2004/0238926 A1 * | 12/2004 | Obinata | 257/678 |

FOREIGN PATENT DOCUMENTS

| | | |
|---|---|---|
| JP | 10079362 A | 3/1998 |
| JP | 2000-260910 A | 9/2000 |
| JP | 2005-216941 A | 8/2005 |
| JP | 2006-100535 A | 4/2006 |

OTHER PUBLICATIONS

Japanese Office Action issued on Jan. 22, 2013 with its English translation, which was issued in the corresponding Japanese Patent Application.

* cited by examiner

Primary Examiner — Julio J Maldonado
Assistant Examiner — Jaehwan Oh
(74) Attorney, Agent, or Firm — Rabin & Berdo, P.C.

(57) ABSTRACT

A semiconductor device having a structure that can reduce stress due to difference in coefficients of thermal expansion and prevent or suppress generation of cracks, and a semiconductor device manufacturing method, are provided. The semiconductor device includes a single crystal silicon substrate having a main face on which semiconductor elements are formed and a side face intersecting with the main face, and a sealing resin provided covering at least a portion of the side face. The side face covered by the sealing resin is equipped with a first face with a plane direction forming an angle of −5° to +5° to the plane direction of the main face.

20 Claims, 19 Drawing Sheets

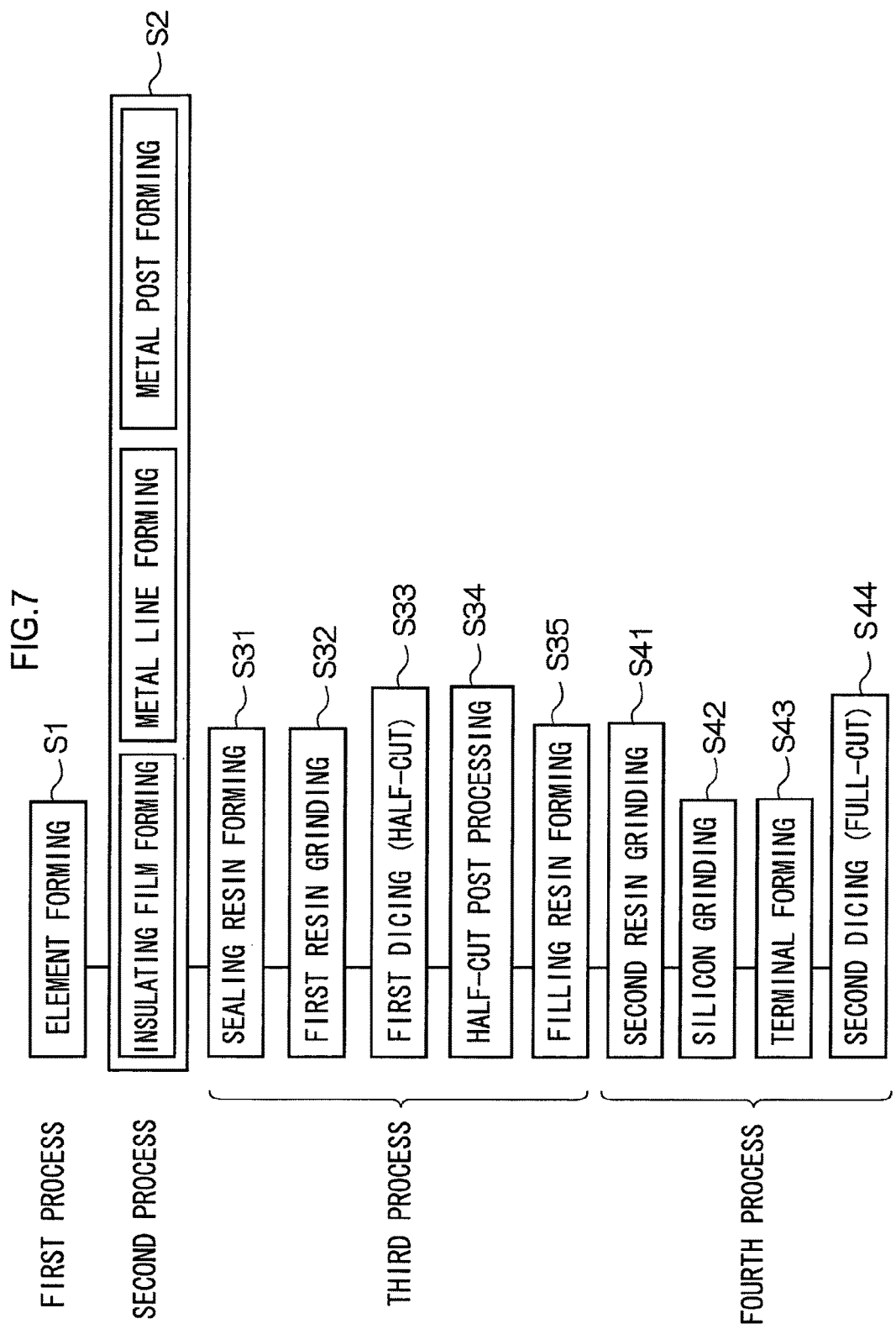

SEMICONDUCTOR DEVICE

CROSS-REFERENCE TO RELATED APPLICATION

This application claims priority under 35 USC 119 from Japanese Patent Application No. 2009-184757, filed on Aug. 7, 2009, the disclosure of which is incorporated by reference herein.

BACKGROUND OF THE INVENTION

1. Field of the Invention

The present invention relates to a semiconductor device and a semiconductor device manufacturing method. The present invention relates, in particular, to a Wafer Level Chip Size Package (W-CSP) and to a manufacturing method thereof.

2. Description of the Related Art

Recently, in, for example, mobile devices, such as mobile phones and personal digital assistants, extremely high demands are being made for reductions in size, reductions in thickness and reductions in weight in order to give higher performance. Reductions in size, reductions in thickness and reductions in weight are therefore also necessary in individual semiconductor devices (semiconductor packages) on a board of a module mounted in such devices. W-CSP technology is a strong candidate for realizing the above.

W-CSP technology is a technology that, after forming connection terminals directly onto semiconductor elements on a wafer when in the wafer state, uses dicing to divide into individual chip for packaging, without the use of metal lines (wire bonding) in order to lead electrical signals out from a semiconductor device. The semiconductor elements are formed on a silicon wafer or on a compound semiconductor wafer, and have various functions such as, for example, diodes, transistors, and the like. The connection terminals are for electrically connecting to a board of a module. By employing such W-CSP technology, it is possible to reduce mounting surface area and weight to $1/10^{th}$ or less, that of a package employing conventional die bonding/wire bonding. In this manner, W-CSP technology directly forms connection terminals to the board of the module, directly above a functional region formed with semiconductor elements, such as diodes, transistors or the like. Accordingly, the inherently wasted region is small with W-CSP technology. Further, productively is extremely good with W-CSP technology due processes up to forming the terminals being performed in the wafer state.

FIG. 11 is a schematic configuration diagram for explaining a method of forming a conventional W-CSP. An interlayer insulation film 30 is formed on a single crystal silicon substrate 10, that has been formed with semiconductor elements of various functions, such as, for example, diodes, transistors or the like. Next, metal pads 36 are formed thereon, connected to the semiconductor elements through via holes (not shown) provided in the interlayer insulation film 30. A passivation film 38 is further formed thereon. Next, via holes (not shown) are formed in the passivation film 38 to expose the metal pads 36. Processes up to this stage are referred to as "front-end processes".

Afterwards, an insulation film 40 is formed of, such as for example, a polyimide, or the like, and via holes (not shown) are formed in the insulation film 40 to expose the metal pads 36. Then metal redistribution lines 44 are formed on the insulation film 40. The metal redistribution lines 44 are connected to the metal pads 36 through the via holes (not shown) formed in the insulation film 40, and the via holes (not shown in) formed in the passivation film 38. Then the metal posts 46 are formed on the metal redistribution lines 44. The sealing resin 50 is then formed. Then the solder terminals 48 are formed on the metal posts 46. Then dicing of the sealing resin 50 and the single crystal silicon substrate 10 is performed with a dicing blade 90.

However, as shown in FIG. 12, in this W-CSP, the side face that has been diced after forming the sealing resin 50 becomes the final side face of the package. Therefore, this W-CSP has a number of weaknesses. One of these is the weakness of moisture absorption in from the package side face. As shown in FIG. 12, the interlayer insulation film 30 is exposed at the package side face after dicing. The interlayer insulation film 30 is an oxidized silicon film formed either by a plasma CVD method, or by a normal pressure CVD method, and the moisture resistance thereof is greatly inferior, in comparison to that of the silicon nitride film employed as the passivation film, the molded resin employed for sealing, or the like.

Structures and manufacturing methods of a semiconductor devices designed to prevent moisture absorption through the interlayer insulation film 30 at the package side wall, are proposed in Japanese Patent Application Laid-Open (JP-A) No. 10-79362, JP-A No. 2000-260910, and JP-A No. 2006-100535. In these structures and manufacturing methods, at a region for exposing the interlayer insulation film 30 in advance prior to mold resin sealing, a dicing cut is inserted partially into the single crystal silicon substrate 10 (half-cut), and the interlayer insulation film 30 is then prevented from being exposed by the subsequent resin sealing.

In such technologies, adhesiveness may deteriorate due to the interlayer insulation film 30 exposed at the package side wall being covered by mold resin. Consequently, adopting different resins for the mold resin and the resin covering the interlayer insulation film 30 exposed at the package side wall could be considered.

In this method, as shown in FIG. 14, the sealing resin 50 is formed in advance, then a half-cut groove 70 is formed partway through the single crystal silicon substrate 10 from the sealing resin 50 side using a dicing blade. Subsequently, as shown in FIG. 13, the half-cut groove 70 is filled with a sealing resin 60 different from the sealing resin 50. Full-cutting into individual chips is performed with a finer dicing blade than that employed when the half-cut groove 70 was formed. By so doing, the interlayer insulation film 30 exposed at the half-cut edge 76 of the dicing in the half-cut groove 70 can be covered by the sealing resin 60 different from the sealing resin 50 used for molding. Consequently, the adhesiveness and the moisture resistance can be raised by this method.

However, in such structures, there is an issue of cracks due to thermal cycling. FIG. 13 shows a crack during thermal cycle testing. Due to full-cutting being performed using a finer dicing blade than that employed when forming the half-cut groove 70, the bottom of the half-cut groove 70 is cut, and large cracks 66 occur in the silicon substrate 10 in the dicing full-cut edge 74, originating from the bottom edge 64 of the half-cut groove 70. These cracks 66 occur due the silicon substrate 10 being unable to forcibly resist resulting thermal stress concentrated at the bottom edge 64 caused by the difference between the coefficients of linear thermal expansion occurring in the differing materials (the sealing resin 60 and the silicon substrate 10) during thermal cycling.

FIG. 14 and FIG. 15, which is an enlarged cross-section of portion B of FIG. 14, show schematically the profile of the half-cut groove 70 of a conventional proposal. The actual half-cut groove 70 is, as schematically shown as a cross-section in FIG. 16, and as shown in the SEM section image of FIG. 17, not completely rectangular, and is of a profile having a rounded portion 62, rounded due to abrasion of the blade tip of the dicing blade. In such cases, the point of stress concentration is, as shown in FIG. 16, the bottom edge 64 of the half-cut groove 70, and stress is concentrated at a single point (in reality a line orthogonal to the plane of the paper). Consequently, the maximum stress becomes is times that of the ideal profile shown in FIG. 15. If the half-cut groove 70 is configured with a vertical side wall 86 and a horizontal bottom 88, then the stress concentration point is the intersection line 84 between the side wall 86 and the bottom 88, and concentration of stress is dissipated by the horizontal bottom portion 88. Accordingly, the maximum stress is smaller when profiled as in FIG. 15 than when the rounded portion 62 of FIG. 16 is formed.

A broad width dicing blade can be employed when the width of the scribe line is wide. Consequently, the profile of the half-cut groove 70 can be made close to that of FIG. 14 and FIG. 15, and the maximum stress can also be held to a small amount. However, when, in order to increase the number of chips obtained, the scribe line width is reduced, a thinner dicing blade must be employed. In such cases, the profile of the bottom of the half-cut groove 70 is not horizontal, and rises more acutely. As a result thereof, profiles like those of FIG. 16 and FIG. 17 arise, stress is concentrated at the bottom edge 64 of the half-cut groove 70, and cracks readily occur due to the large stresses imparted during thermal cycling.

SUMMARY OF THE INVENTION

The present invention provides a semiconductor device having a structure, and a semiconductor device manufacturing method, that can reduce stress due to difference in coefficients of thermal expansion and can prevent or suppress generation of cracks.

A first aspect of the present invention is a semiconductor device including: a single crystal semiconductor substrate, having a main face on which semiconductor elements are formed and a side face intersecting with the main face, and a first insulator provided to cover at least a portion of the side face, wherein the side face covered by the first insulator is equipped with a first face with a plane direction forming an angle of between −5° and +5° to the plane direction of the main face.

In the first aspect of the present invention, by providing the first face with a plane direction forming an angle of between −5° and +5° to the plane direction of the main face, concentration of stress can be dissipated by the first face, and generation of cracks can be prevented or suppressed.

Another aspect of the present invention, in the above aspect, the first face may be a face with a plane direction forming an angle of between −3.5° and +3.5° to the plane direction of the main face.

In the above aspect of the present invention, by the first face having a plane direction forming an angle of between −3.5° and +3.5° to the plane direction of the main face, concentration of stress can be more effectively dissipated and generation of cracks can be prevented or suppressed. Further, the above aspect of the present invention can achieve twice the deflection strength, compared to the conventional technology.

Another aspect of the present invention, in the first aspect, the first face may be a face with a plane direction that is the same as the plane direction of the main face.

In the above aspect of the present invention, by the first face being a face with a plane direction that is the same as the plane direction of the main face, stress concentration can be even more effectively dissipated, and generation of cracks can be prevented or suppressed.

Another aspect of the present invention, in the above aspect, the side face covered by the first insulator further may be equipped with a second face disposed to the inside of the first face and intersecting with the first face at an obtuse angle.

In the above aspect of the present invention, concentration of stress is more effectively dissipated by the second face, and generation of cracks can be prevented or suppressed.

Another aspect of the present invention, in the first aspect, an edge of the first face may be an edge of the boundary between the side face and the first insulator.

Another aspect of the present invention, in the first aspect, may further include a second insulator provided above the main face, wherein the side face covered by the first insulator may further include a third face disposed to the inside of the first face and intersecting with the main face, the line of intersection of the third face with the main face may be disposed further to the inside than an edge of the second insulator, and a portion of the first insulator may extend out further to the inside than the edge of the second insulator.

Another aspect of the present invention, in the above aspect, the second insulator may be an interlayer insulating film.

Another aspect of the present invention, in the above aspect, the second insulator may be a sealing resin.

Another aspect of the present invention, in the above aspect, the second insulator may be an interlayer insulating film and the semiconductor device may further include a sealing resin provided above the interlayer insulating film.

Another aspect of the present invention, in the first aspect, the first insulator may be a sealing resin.

Another aspect of the present invention, in the above aspect, the first insulator may be a sealing resin different from the sealing resin of the second insulator.

Another aspect of the present invention, in the above first aspect, the main face may be a (100) face, and the first face may be a (100) face.

Another aspect of the present invention, in the above aspect, the main face may be a (100) face, the first face may be a (100) face, and the second face may be a (111) face.

Another aspect of the present invention, in the above aspect, the main face may be a (100) face, the first face may be a (100) face, and the third face may be a (110) face.

Another aspect of the present invention, in the first aspect, the main face may be a (110) face and the first face may be a (110) face.

Another aspect of the present invention, in the first aspect, the single crystal semiconductor substrate may be either a single crystal semiconductor substrate of diamond structure or a compound single crystal semiconductor substrate of zincblende structure.

Another aspect of the present invention, in the first aspect, may further include metal redistribution lines provided on the main face and electrically connected to the semiconductor elements, and external connection terminals connected to the metal redistribution lines.

Another aspect of the present invention, in the first aspect, the semiconductor device may be a wafer level chip size package.

A second aspect of the present invention is a semiconductor device manufacturing method, including: preparing a single crystal semiconductor substrate for dividing into plural chip shaped semiconductor devices; mechanically forming a first groove, partway through the single crystal semiconductor substrate from a main face of the single crystal semiconductor substrate along a scribe line, for dividing the single crystal semiconductor substrate into the plural semiconductor devices; etching the single crystal semiconductor substrate exposed in the first groove; filling the first groove with a first insulator after etching; and forming a second groove, having a narrower width to that of the first groove, from a bottom portion of the first groove through to the face of the single crystal semiconductor substrate on the opposite side to that of the main face, dividing the single crystal semiconductor substrate into the plural semiconductor devices, wherein a first face is formed to the single crystal semiconductor substrate at a bottom portion of the first groove by etching the single crystal semiconductor substrate, with the first face having a plane direction that forms an angle of between −5° and +5° to the plane direction of the main face.

In the second aspect of the present invention, by the first face being a face with a plane direction forming an angle of between −5° and +5° to the plane direction of the main face, concentration of stress can be dissipated, and generation of cracks can be prevented or suppressed.

In the second aspect of the present invention, crystal defects and fine cracks that have occurred when mechanically forming the first groove can be removed by etching. Consequently, the second aspect of the present invention can raise the strength of the single crystal semiconductor substrate, and can be prevent or suppress cracks from occurring.

Another aspect of the present invention, in the second aspect, the first face may be a face with a plane direction forming an angle of between −3.5° and +3.5° to the plane direction of the main face.

Another aspect of the present invention, in the second aspect, the first face may be a face with a plane direction that is the same as the plane direction of the main face.

Another aspect of the present invention, in the second aspect, by etching the single crystal semiconductor substrate, a second face may be formed disposed to the inside of the first face with the second face intersecting with the first face at an obtuse angle.

Another aspect of the present invention, in the second aspect, an edge of the first face may be exposed at a side face of the chip shaped semiconductor device.

Another aspect of the present invention, in the second aspect, may further include, forming a second insulator above the main face, wherein the first groove may be mechanically formed in the second insulator and the single crystal semiconductor substrate.

Another aspect of the present invention, in the above aspect, by etching the single crystal semiconductor substrate, a third face may be formed at the inside of the first face with the third face intersecting with the main face, with the line of intersection of the third face with the main face disposed further to the inside than an edge of the second insulator, and, by a process of filling the first insulator in the first groove, the first insulator may be filled in the first groove such that a portion of the first insulator extends out further to the inside than the edge of the second insulator exposed at the first groove.

Another aspect of the present invention, in the second aspect, the second insulator may be an interlayer insulating film.

Another aspect of the present invention, in the above aspect, the second insulator may be a sealing resin.

Another aspect of the present invention, in an above aspect, the second insulator is an interlayer insulating film, may be including a process for further forming a sealing resin on the interlayer insulating film, and the first groove may be mechanically formed in the interlayer insulating film, the sealing resin, and the single crystal semiconductor substrate.

Another aspect of the present invention, in the above aspect, the first insulator may be a sealing resin.

Another aspect of the present invention, in the above aspect, the first insulator may be a sealing resin different from the sealing resin of the second insulator.

Another aspect of the present invention, in the above second aspect, the main face may be a (100) face, and the first face may be a (100) face.

Another aspect of the present invention, in the above aspect, the main face may be a (100) face, the first face may be a (100) face, and the second face may be a (111) face.

Another aspect of the present invention, in the above aspect, the main face may be a (100) face, the first face may be a (100) face, and the third face may be a (110) face.

Another aspect of the present invention, in the second aspect, the main face may be a (110) face and the first face may be a (110) face.

Another aspect of the present invention, in the second aspect, the single crystal semiconductor substrate may be a single crystal silicon substrate, and the etching may be wet etching to anisotropic etch the silicon single crystal substrate.

Another aspect of the present invention, in the above aspect, the wet etching may be with a KOH aqueous solution, a NaOH aqueous solution, a TMAH aqueous solution, or hydrazine.

Another aspect of the present invention, in the second aspect, the single crystal semiconductor substrate may be either a single crystal semiconductor substrate of diamond structure or a compound single crystal semiconductor substrate of zincblende structure.

Another aspect of the present invention, in the second aspect, may further include metal redistribution lines provided on the main face and electrically connected to the semiconductor elements, and external connection terminals connected to the metal redistribution lines.

Another aspect of the present invention, in the second aspect, the semiconductor device may be a wafer level chip size package.

A third aspect of the present invention is a semiconductor device including, a semiconductor substrate having a main face on which semiconductor elements are formed, and a side face intersecting with the main face, a first insulator provided above the main face, and a second insulator provided covering at least a portion of the side face, wherein the side face covered by the first insulator includes a face that intersects with the main face, the line of intersection between the face and the main face is disposed further to the inside that an edge of the first insulator, and a portion of the second insulator extends further to the inside than the edge of the first insulator.

According to the third aspect of the present invention, the adhesiveness of the first insulator to the semiconductor substrate can be raised.

Another aspect of the present invention, in the third aspect, the second insulator may be provided covering the edge of the first insulator.

Another aspect of the present invention, in the third aspect, the first insulator may be an interlayer insulating film.

Another aspect of the present invention, in the third aspect, the first insulator may be a sealing resin.

Another aspect of the present invention, in the third aspect, the first insulator may be an interlayer insulating film, and a sealing resin may be further provided on the interlayer insulating film.

Another aspect of the present invention, in the third aspect, the second insulator may be a sealing resin.

Another aspect of the present invention, in the above aspect, the first insulator may be a sealing resin that is different from the sealing resin of the second insulator.

Another aspect of the present invention, in the third aspect, the main face may be a (100) face, and the face may be a (110) face.

Another aspect of the present invention, in the third aspect, the main face may be a (110) face and the first face may be a (111) face.

Another aspect of the present invention, in the third aspect, the semiconductor device may be a wafer level chip size package.

A fourth aspect of the present invention is a manufacturing method of a semiconductor device, including: preparing a semiconductor substrate for dividing into plural chip shaped semiconductor devices, with the semiconductor substrate having a first insulator provided above a main face of the semiconductor substrate; mechanically forming a first groove in the first insulator and the semiconductor substrate along a scribe line for dividing the semiconductor substrate into the plural semiconductor devices; etching the semiconductor substrate exposed in the first groove; filling the first groove with a second insulator after etching; and forming a second groove, having a narrower width to that of the first groove, from a bottom portion of the first groove through to the face of the semiconductor substrate on the opposite side to that of the main face, dividing the semiconductor substrate into the plural semiconductor devices, wherein the first groove is formed from the main face of the semiconductor substrate part way through the semiconductor substrate, a face that intersects with the main face is formed by etching the semiconductor substrate, the line of intersection between the face and the main face is disposed further to the inside that an edge of the first insulator, and, by filling the second insulator in the first groove, a portion of the second insulator extends further to the inside than an edge of the first insulator exposed in the first groove.

The fourth aspect of the present invention can raise the adhesiveness of the second insulator to the semiconductor substrate. Consequently, the fourth aspect can raise the adhesiveness of the first insulator to the semiconductor substrate.

Furthermore, by etching, the fourth aspect of the present invention can remove crystal defects and fine cracks that have occurred when mechanically forming the first groove. Accordingly, the fourth aspect of the present invention can raise the strength of the semiconductor substrate, and can prevent or suppress cracks from developing.

Another aspect of the present invention, in the fourth aspect, the first insulator may be an interlayer insulating film.

Another aspect of the present invention, in the fourth aspect, the first insulator may be a sealing resin.

Another aspect of the present invention, in the fourth aspect, the first insulator may be an interlayer insulating film, and may further include, forming a sealing resin on the interlayer insulating film, wherein the first groove may be mechanically formed in the interlayer insulating film, the sealing resin, and the semiconductor substrate.

Another aspect of the present invention, in the above aspect, the first insulator may be a sealing resin that is different from the sealing resin of the second insulator.

Another aspect of the present invention, in the fourth aspect, the main face may be a (100) face, and the face may be a (110) face.

Another aspect of the present invention, in the fourth aspect, the main face may be a (110) face and the first face may be a (111) face.

Another aspect of the present invention, in the fourth aspect, the semiconductor substrate may be a single crystal silicon substrate, and the etching may be wet etching that anisotropic etches the single crystal silicon substrate.

Another aspect of the present invention, in the fourth aspect, the semiconductor device may be a wafer level chip size package.

Accordingly, the present invention can provide a semiconductor device having a structure, and a semiconductor device manufacturing method, that can reduce stress caused by a difference in coefficients of thermal expansion and can prevent or suppress cracks from occurring.

Further, the semiconductor device of the present invention can reduce stress caused by a difference in the coefficients of thermal expansion even when produced with, for example, a thin dicing blade. Consequently, the semiconductor device of the present invention can be set with finer scribe lines, and the number of chips obtained can be increased.

BRIEF DESCRIPTION OF THE DRAWINGS

Exemplary embodiments of the present invention will be described in detail based on the following figures, wherein:

FIG. 7 is a process diagram for explaining a manufacturing method of a semiconductor device of an exemplary embodiment of the present invention;

DETAILED DESCRIPTION OF THE INVENTION

Explanation follows of an exemplary embodiment of the present invention, with reference to the drawings.

Figure 1:
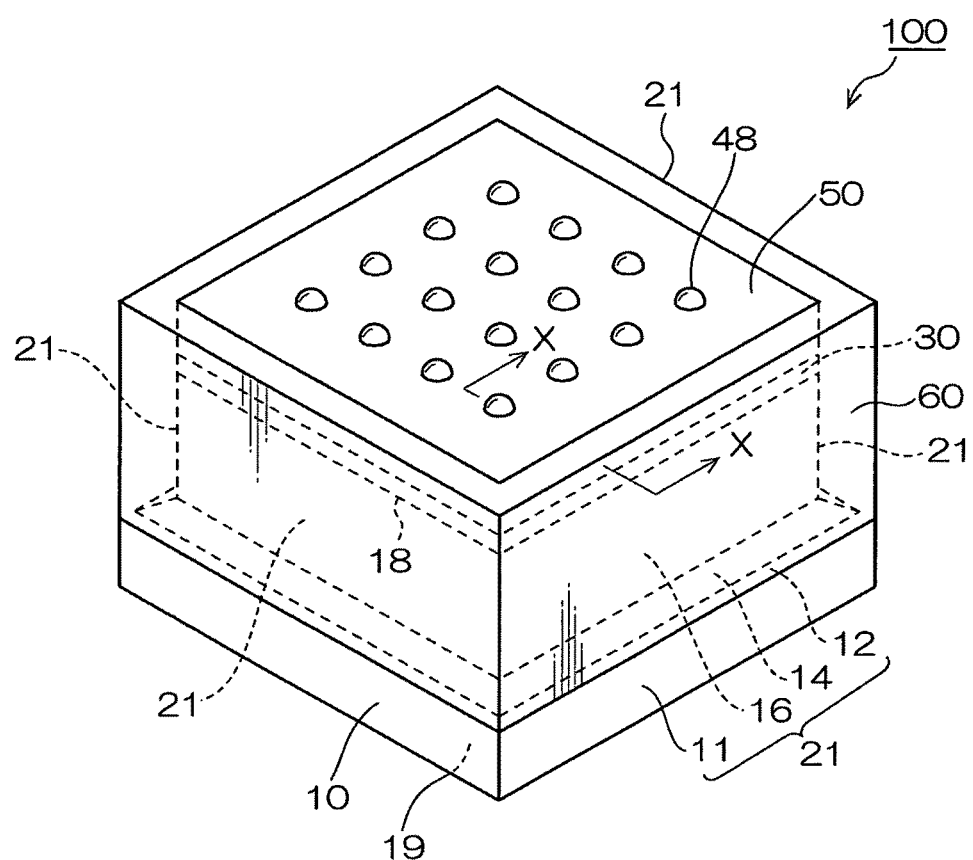
FIG. 1 is a schematic perspective diagram for explaining a semiconductor device of an exemplary embodiment of the present invention.
Figure 2:
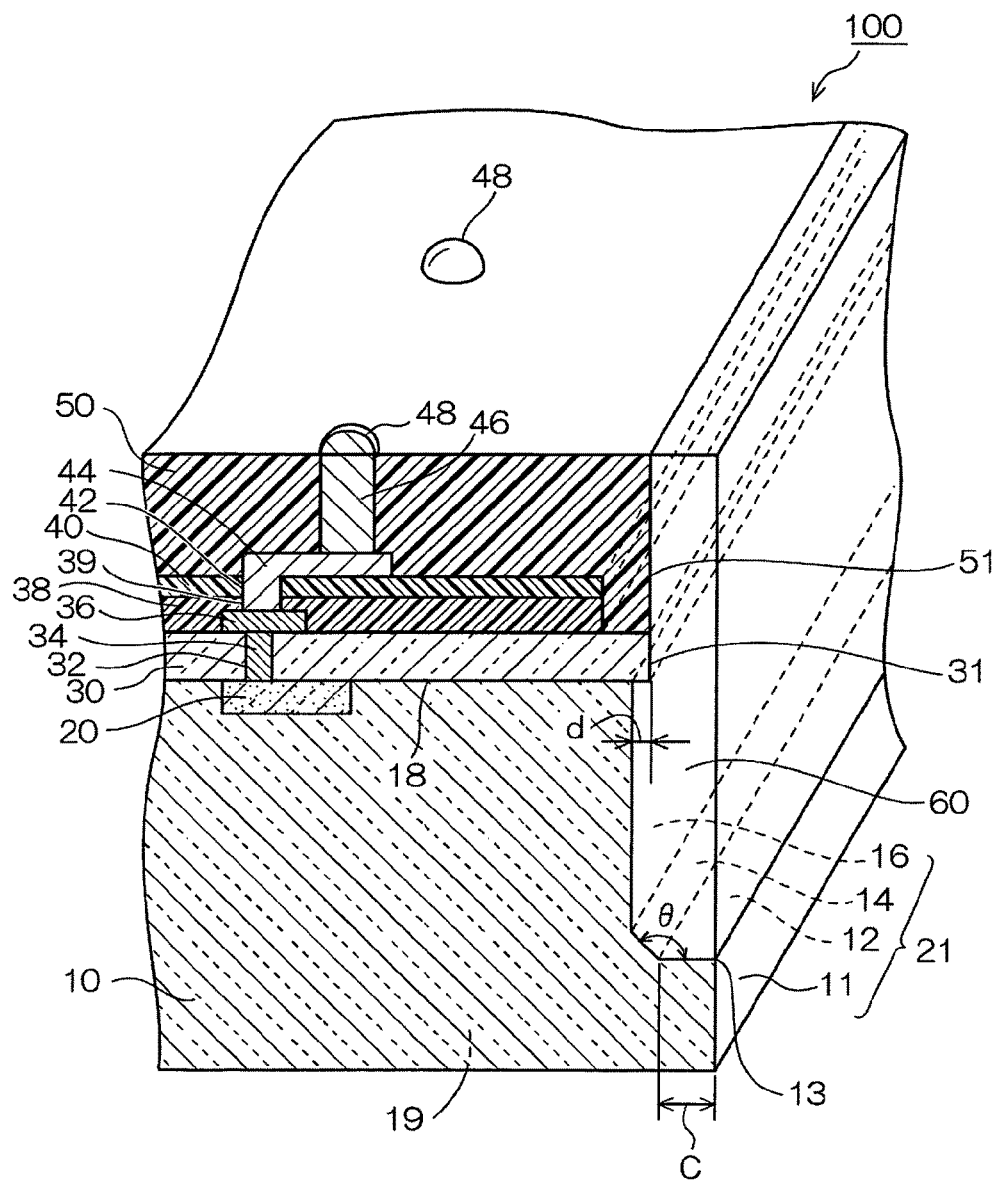
FIG. 2 is a cross-section taken on line X-X of FIG. 1.

As shown in FIG. 1 and FIG. 2, in a W-CSP 100, which is a semiconductor device of the present exemplary embodiment, semiconductor elements 20 of various functionality, such as, for example, diodes, transistors or the like, are formed on a main face 18 that is one of the faces of a single crystal silicon substrate 10. An interlayer insulation film 30 is formed on the one main face 18 of the single crystal silicon substrate 10. Via holes 32 are provided in the interlayer insulation film 30. Metal pads 36 are formed on the interlayer insulation film 30 and are connected to the semiconductor elements 20 through embedded electrodes 34 provided in the via holes 32. A passivation film 38 is formed on the interlayer insulation film 30, covering the metal pads 36. Via holes 39 are provided in the passivation film 38, exposing the metal pads 36. An insulation film 40 is formed of, for example, a polyimide or the like, and is provided on the passivation film 38. Via holes 42 are provided in the insulation film 40, to be in communication with the via holes 39, in order to connect to the metal pads 36. Metal redistribution lines 44 are provided on the insulation film 40 for connecting to the metal pads 36 through the via holes 42 and the via holes 39. Metal posts 46 are provided on the metal redistribution lines 44. A sealing resin 50 is provided on the insulation film 40 so as to embed the metal posts 46. Solder terminals 48 are provided on the metal posts 46, so as to be exposed from the sealing resin 50. The solder terminals 48 are employed as connection terminals for electrically connecting to a board of a module (not shown).

The single crystal silicon substrate 10 includes the main face 18, a bottom face 19, and four side faces 21. A (100) substrate is employed in the present exemplary embodiment, and the main face 18 and the bottom face 19 are (100) faces. The side faces 21 includes, in sequence from the bottom face, an edge face 11, a processed face 12, a processed face 14, and a processed face 16. The edge face 11 is, as described below, a face cut with a dicing blade 94 (see FIG. 8J), and is substantially perpendicular to the main face 18. The processed faces 12, 14, 16 are, as described below, formed by anisotropic etching using a KOH aqueous solution on a half-cut groove 70 formed by a dicing blade 92 (see FIG. 8D). The processed face 12 is a (100) face, and is a face parallel to the main face 18. The processed face 14 is a (111) face, and the angle θ formed by the processed face 14 to the processed face 12 is about 125°. The processed face 16 is a (110) face, and is a face perpendicular to the main face 18. Note that, an edge 13 of the processed face 12 is a line cut by the dicing blade 94 (see FIG. 8J), and is the edge of the boundary between the side face 21 and a sealing resin 60.

In the present exemplary embodiment, the processed faces 12, 14, 16, an edge face 31 of the interlayer insulation film 30, and an edge face 51 of the sealing resin 50 are covered by a sealing resin 60.

The processed face 12 is a (100) face, and is a face parallel to the main face 18. Consequently, stress concentration due to any difference in coefficients of thermal expansion between the single crystal silicon substrate 10 and the sealing resin 60 can be dissipated. Furthermore, the processed face 14 forming an angle of about 125° to the processed face 12 is formed at the inside of the processed face 12. Consequently, the processed face 12 can further dissipate stress. Note that the width of the processed face 12 is preferably 2 μm to 15 μm. When the width of the processed face 12 is less than 2 μm, process control is difficult from the standpoint of processing precision. When the width of the processed face 12 exceeds 15 μm, the half-cut width A needs to be increases, and the Si etching amount needs to be less than 15 μm. Consequently, constraints on the gridline dimensions increase when the width of the processed face 12 exceeds 15 μm, and is also difficult to obtain sufficient substrate strength.

Figure 8A:
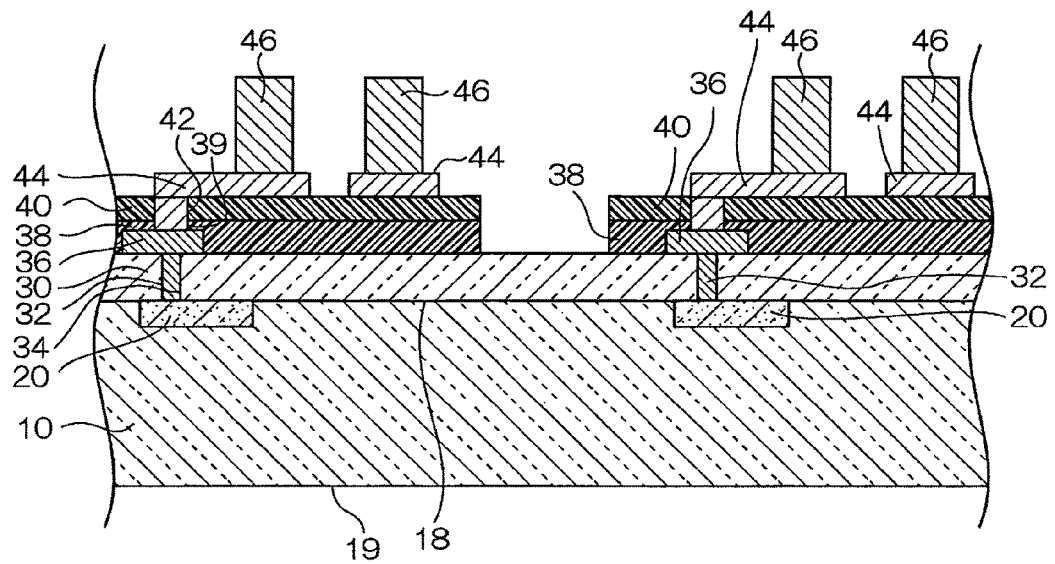
FIG. 8A to FIG. 8J are schematic vertical cross-sections for explaining a manufacturing method of a semiconductor device of an exemplary embodiment of the present invention.
Figure 8B:
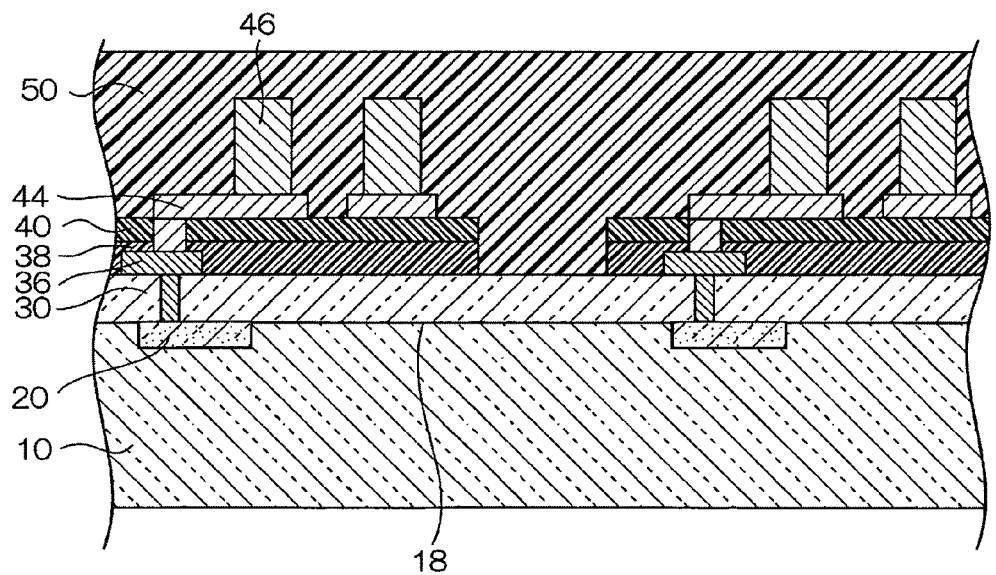
Figure 8C:
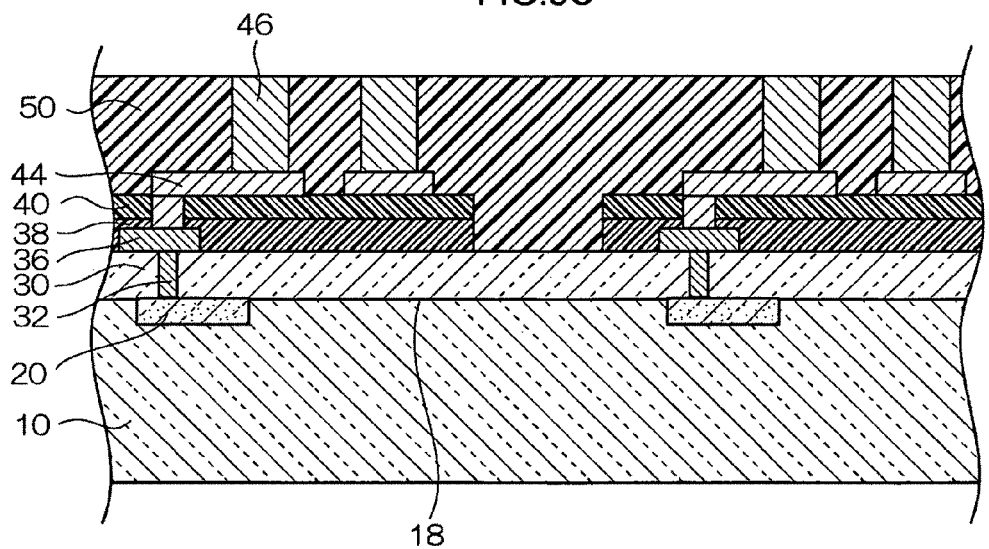
Figure 8D:
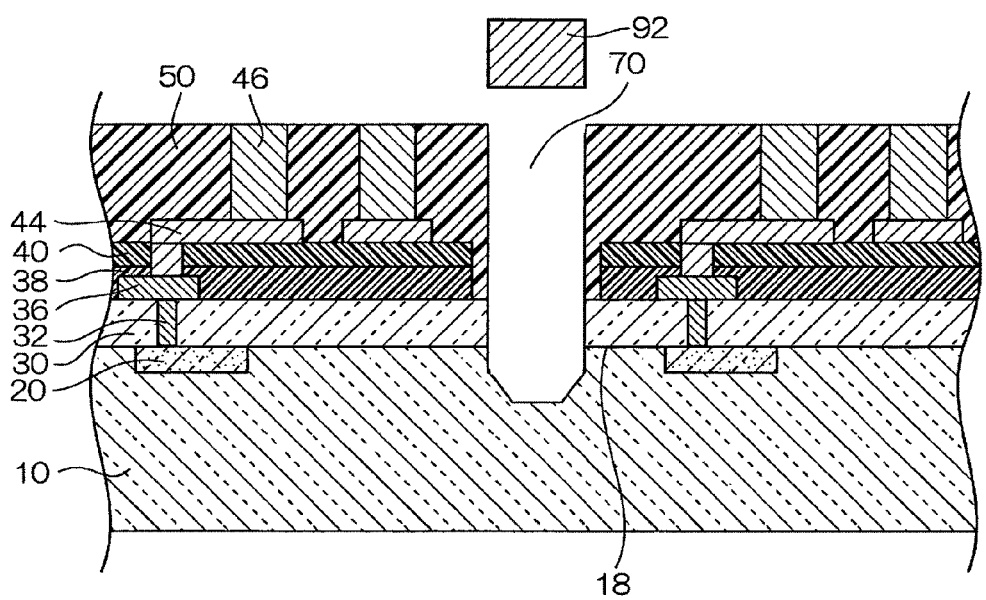

The edge face 31 of the interlayer insulation film 30 and the edge face 51 of the sealing resin 50 are faces cut by the dicing blade 92 (see FIG. 8D). The side face of the single crystal silicon substrate 10 therebelow is also in the same plane as the edge face 31 and the edge face 51, when in a cut state. However, a single crystal face (110) appears and the side face of the single crystal silicon substrate 10 is shifted inwards by a distance d due to anisotropic etching with a KOH aqueous solution. The sealing resin 60 covering the processed face 16 also extends further towards the inside, than the edge face 31 and the edge face 51, by the distance d.

In contrast to the sealing resin 50, a highly adhesive resin is employed for the sealing resin 60. The adhesiveness in the (110) direction is even greater, since the sealing resin 60 also undercuts to the inside by the distance d. As a result, the sealing resin 60 can, in particular, suppress or prevent moisture from penetrating in from the edge face 31 of the interlayer insulation film 30, and can further raise moisture resistance. Note that the distance d is preferably from 1 μm to 10 μm. The etching speed of the KOH on Si (110) faces is substantially equivalent to that on the Si (100) faces. Therefore, the preferably range of the distance d and the preferably range of depth α are in a 1:1 correspondence. The substrate deflection strength for etching 1 μm of Si becomes about double, and sufficient strength can be expected. A raised adhesive strength of the sealing resin 60 can also be expected to result. However, when the distance d exceeds 10 μm, then a limit is substantially reached to improvements in the substrate strength, and becomes difficult to secure the Si (111) face and the processed face 12. When 1 μm of Si etching is performed, the processed face 12 is narrowed by 0.7 μm.

Figure 3:
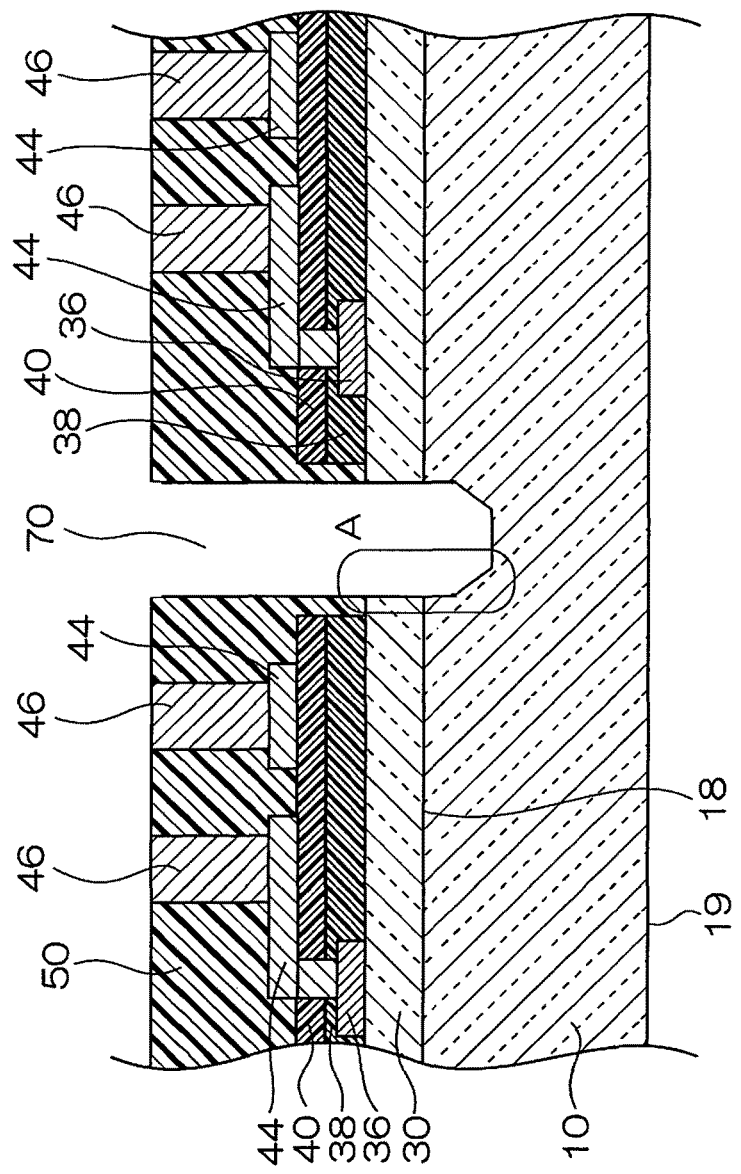
FIG. 3 is a schematic vertical cross-section for explaining a structure and manufacturing method of a semiconductor device of an exemplary embodiment of the present invention.
Figure 4:
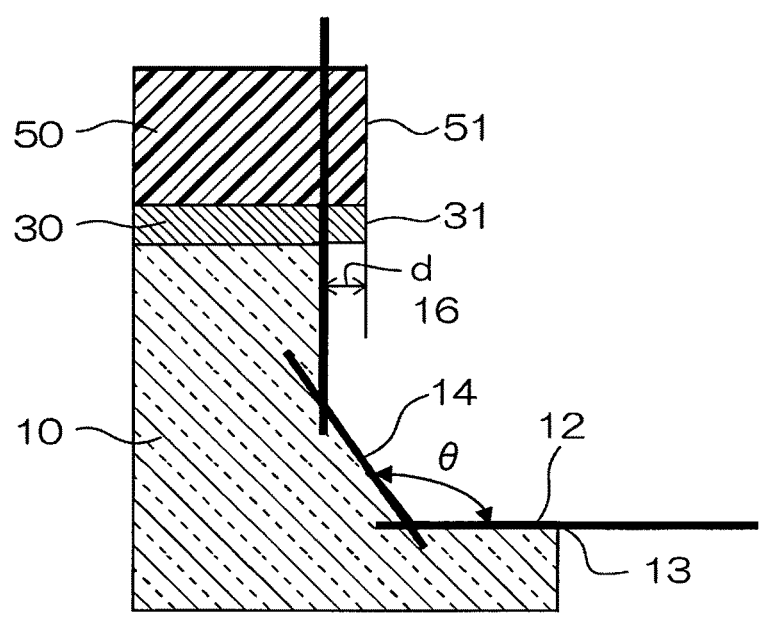
FIG. 4 is an enlarged schematic cross-section of portion A of FIG. 3.

The half-cut groove 70 formed by the dicing blade 92 (see FIG. 8D) is shown in FIG. 3 and FIG. 4, schematically showing the profile of the bottom portion and side portions of the half-cut groove 70 in a state formed by anisotropic etching with a KOH aqueous solution.

As described above; the profile of the half-cut bottom portion, namely the processed face 12 in FIG. 4, is parallel to the main face 18 of the Si substrate. The processed face 12 is a Si (100) face when a Si (100) substrate is employed. The profile of the side portions configuring the processed face 16 and the processed face 14, are a Si (110) face and a Si (111) face, respectively. In such a case, the processed face angle θ, as denoted in FIG. 4, between the processed face 14 and the processed face 12, becomes θ=180°−about 55°=about 125°. The processed face 16 has an indented (undercut) profile on the active region side further to the inside than the processed face (the edge face 51 of the sealing resin) when the half-cut is formed. Furthermore, the processed face 12 has a structure that remains after processing into individual chips (full-cutting).

Figure 5:
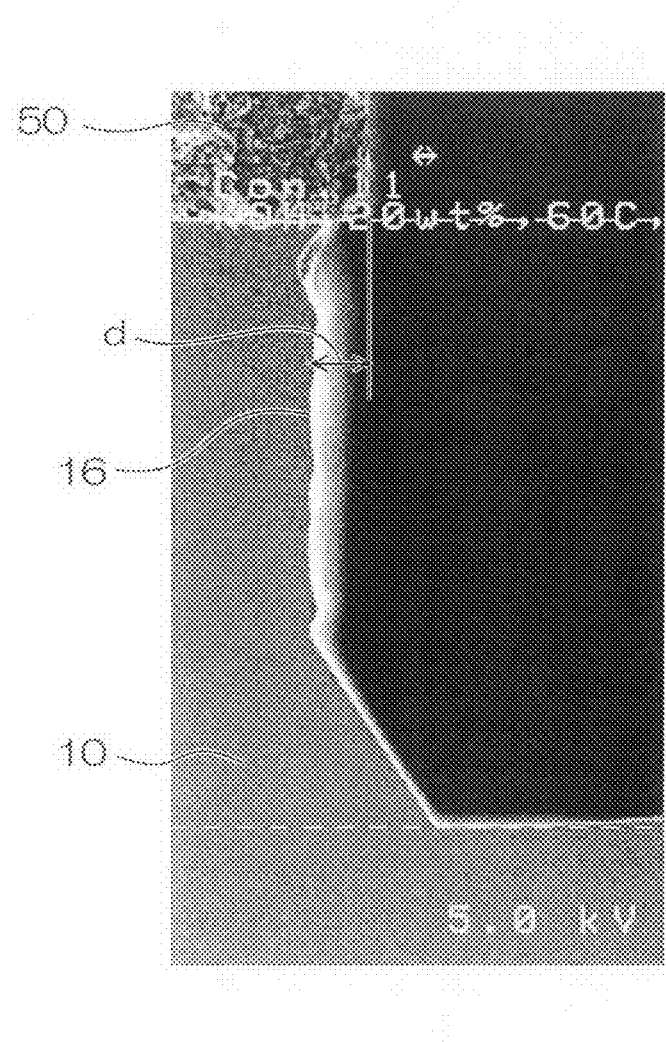
FIG. 5 is an SEM image of a portion corresponding to FIG. 4.
Figure 17:
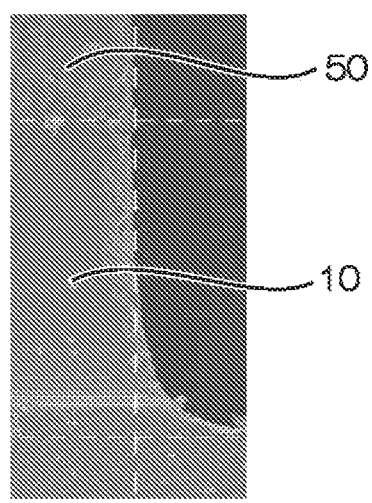
FIG. 17 is an SEM image of a portion corresponding to FIG. 16.

An SEM image of a test result is shown in FIG. 5. The processed face has, as described above, characteristics of a crystal face of the substrate, and is not a rounded profile of a bottom portion like that of the conventional example shown in FIG. 17, and the processed face 16 can be realized with an undercut profile further to the inside than the sealing resin edge.

Figure 6:
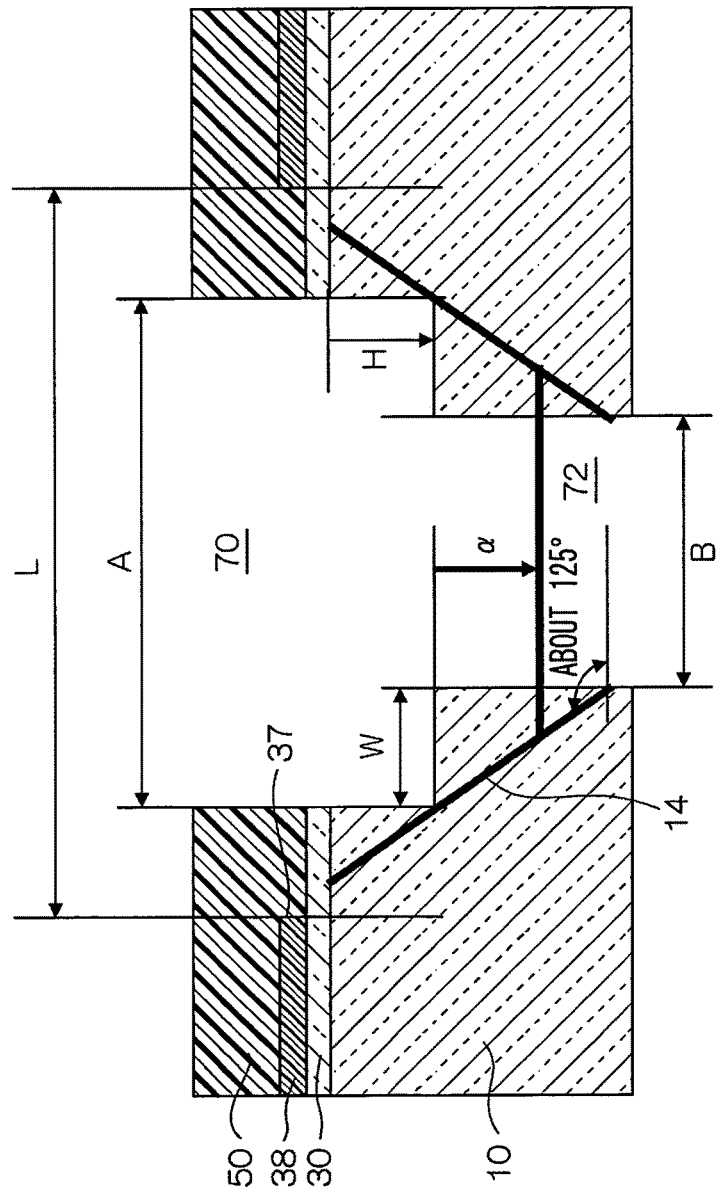
FIG. 6 is a schematic vertical cross-section for explaining a manufacturing method of a semiconductor device of an exemplary embodiment of the present invention.

Detailed explanation follows regarding the plan view structure of the present exemplary embodiment, with reference to FIG. 6. Explanation follows regarding half-cuts and full-cuts in the drawings, when each are formed using a diamond blade. However, the present exemplary embodiment is not intrinsically dependent on the method for forming the half-cut and full-cut.

The scribe line width (defined here as the separation distance between respective passivation films 38) is denoted L, the dicing width the first time (width of the half-cut groove 70) is denoted A, the entry depth of the half-cut into the silicon substrate is denoted H, the dicing width the second time (width of a full-cut groove 72) is denoted B, the clearance separation between the half-cut groove 70 and the full-cut groove 72 (defined here as the grip width) is denoted W, the silicon etching amount generated by processing after half-cutting (defined here as the depth from the bottom portion of the half-cut) is denoted $\alpha$, and the face formed by the same processing with the characteristics of a Si (111) face is denoted as processed face 14. Preferably (L−A)/2=about 5 µm to 10 µm is secured for the separation interval between the scribe line and dicing for the first time. When this separation is narrower than 5 µm, the possibility arises of dicing affecting the element region (the region to the inside of an edge 37 of the passivation film 38) due to variations during production, such as variation in the dicing groove width, misalignment during dicing or the like. Further, when this separation is made greater than 10 µm, it becomes difficult to secure limits for value of the grip width W denoted here. Further, preferably, the grip width W is ensured such that W=(A−B)/2=about 10 µm. In such cases, the maximum value $\alpha$ of the Si etching amount after processing is $\alpha$ (maximum value)=(L−A)/2 when H×tan 35°>(L−A)/2, and $\alpha$ (maximum value)=W/(tan 35°)=less than about 1.43×W µm, when H×tan 35°≦(L−A)/2. In the former case, when etching on a silicon substrate 10 is performed of (L−A)/2 µm or greater, the side etching regions affect the element region. Furthermore, in the latter case, when etching on a silicon substrate 10 is performed of about 1.43×W µm or greater, the processed face 12 (Si (100) face) is removed by dicing for the second time (full-cutting).

Figure 15:
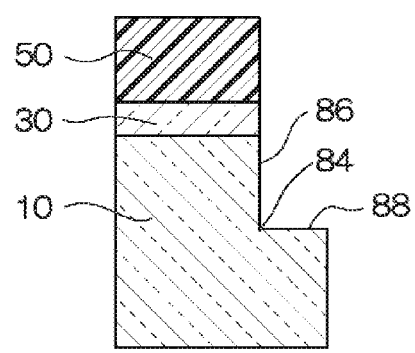
FIG. 15 is an enlarged schematic cross-section of portion B of FIG. 14.
Figure 16:
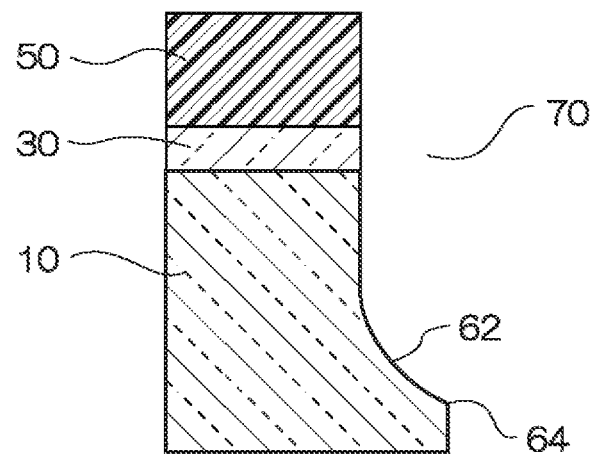
FIG. 16 is an enlarged schematic cross-section for explaining portion B of FIG. 14.

When the profile of the bottom portion after forming the half-cut groove 70 with the dicing blade and prior to etching, is not the rectangular profile like that of FIG. 6 (like that of FIG. 15), and is a rounded profile like that of FIG. 16, the processed face 14 (Si (111) face) arising from etching the silicon substrate of FIG. 6 is shifted so circumscribe the rounded profile. As a result, the maximum value $\alpha$ of the etching amount of the silicon substrate is smaller (the processing range is narrower) as the rounded profile becomes larger (the chamfered amount becomes greater). Consequently, the profile of the blade employed for half-cutting is preferably close to a rectangular profile.

Next, explanation follows regarding a manufacturing method of the present exemplary embodiment, with reference to the production flow of FIG. 7, and the cross-section diagrams of FIG. 8A to FIG. 8J. The manufacturing method, has four processes, namely is configured with a first process (generally referred to as "semiconductor front-end processing"), a second process, a third process and a fourth process. In the first process, the semiconductor elements 20, such as, for example, diodes, transistors, and the like, are formed on the main face 18 of the silicon substrate 10, then the metal pads 36 employed for external connection are formed on the main face 18, and the passivation film 38 is formed. In the second process, the metal redistribution lines 44, for electrically relaying between the solder terminals 48 (described below) for electrical connection to the board of the module and the metal pads 36, and the metal posts 46, are formed on the passivation film 38. In the third process, the sealing resin 50 is formed covering the metal redistribution lines 44 and the metal posts 46. In the fourth process, the thickness of the sealing resin 50 and the thickness of the silicon substrate 10 are finished to the desired thicknesses, then finally divided into individual chips.

Explanation follows first regarding the first process (step S1). As shown in FIG. 8A, the semiconductor elements 20, such as, for example, diodes, transistors, and the like, are formed on the main face 18 of the single crystal silicon substrate 10. Then, the interlayer insulation film 30 is formed on the main face 18 of the single crystal silicon substrate 10. Next, the via holes 32 are provided in the interlayer insulation film 30, and the via holes 32 are filled with the embedded electrodes 34. Next, the metal pads 36 employed for external connection, which are connected to the semiconductor elements 20 through the embedded electrodes 34, are formed on the interlayer insulation film 30. Then the passivation film 38 is formed covering the metal pads 36, and the via holes 39 are formed in the passivation film 38 such that the metal pads 36 are exposed. Processing up to this process is referred to as "front-end processing".

Subsequently, the insulation film 40 of, for example, a polyimide or the like, is formed, and the via holes 42 are formed in the insulation film 40 such that the metal pads 36 are exposed. Then, the metal redistribution lines 44 are formed on the insulation film 40, and metal redistribution lines 44 are connected to the metal pads 36 through the via holes 42 formed in the insulation film 40 and the via holes 39 formed in the passivation film 38. Then the metal posts 46 are formed on the metal redistribution lines 44 (step S2).

Then, as shown in FIG. 8B, the first sealing resin 50 is formed to cover the metal redistribution lines 44 and the metal posts 46 (step S31). The sealing resin 50 may be formed, for example, by pressure injection using a mold, a spin coating method, a spray coating method, screen printing, or the like.

Then, as shown in FIG. 8C, resin grinding is performed for a first time (step S32). In the first time of resin grinding, the heads of the metal posts 46 are exposed, and preferably grinding finishes at a shallower depth (a thicker resin thickness) than the final resin film thickness. However, the first time of resin grinding is not always required when the sealing resin 50 is a resin that is transparent to visible light.

The sealing resin 50 is made into a thin film in advance, and the surfaces of the metal posts 46 are exposed above the sealing resin 50. Due thereto, the alignment precision during dicing (half-cutting) in the next process is raised, and also the filling ability of the second sealing resin can be improved.

Next, as shown in FIG. 8D, the dicing blade 92 is employed, and the half-cut groove 70, to be filled with the second resin, is formed along the scribe line on the single crystal silicon substrate 10 (step S33). The effect of the present exemplary embodiment is not intrinsically dependent on the stage at which the half-cut groove 70 is formed, (namely, on whether the half-cut groove 70 is formed after the sealing resin 50 has been formed advance, or the sealing resin 50 is formed after the half-cut groove 70 has been formed in advance), and both cases are applicable.

The depth of the half-cut groove 70 needs to go deeper than the interlayer insulation film 30. A preferable example is where the bottom portion of the half-cut groove 70 is positioned about 50 µm to 200 µm from the surface (main face 18) of the silicon substrate on which the semiconductor elements 20 are formed. It is possible to form a groove that is deeper than the interlayer insulation film 30 in a stable production process as long as the depth of the half-cut groove 70 is 50 µm or greater. Further, it is possible to secure sufficient wafer strength during production, and wafer splitting in subsequent processes due to the half-cut groove 70 can be suppressed, by making the depth of the half-cut groove 70 200 µm or less. The width of the half-cut groove 70 needs to be made wider than the width of the subsequent second time of dicing (full-cut) (A−B>0; see FIG. 6). Preferably (A−B)/2 is about 10 µm or greater, as described above.

Figure 8E:
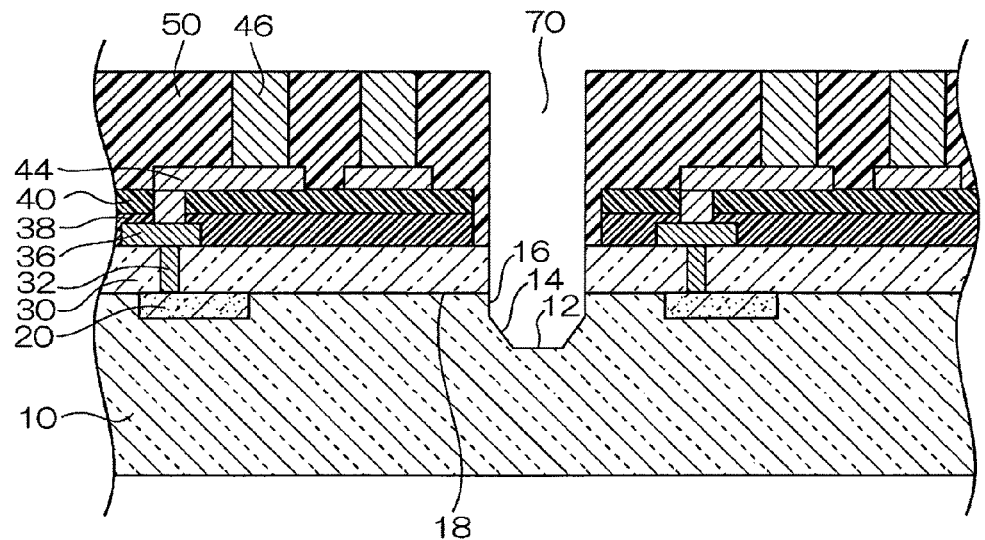

As shown in FIG. 8E, after forming the half-cut groove 70, processing is performed to the profile of the bottom portion and side portions of the half-cut groove 70 in order to achieve the profile as shown in FIG. 4 and FIG. 5 (step S34).

In this processing, for example, potassium hydroxide (KOH), sodium hydroxide (NaOH), tetra methyl ammonium hydroxide (TMAH), hydrazine ($N_2H_4$), or the like is employed. In wet etching of the single crystal silicon substrate using these agents, anisotropic etching can be performed, since the etching speed of the (111) face is much small than that of the other faces, such as, for example, (100) faces and (110) faces.

When use on a semiconductor production line is considered, KOH processing is the most easy to handle out of the above agents. Therefore, a KOH aqueous solution was employed for a sample of the present exemplary embodiment. The KOH aqueous solution selectively etches only the (100) face and the (110) face or the silicon substrate, and the profile shown in FIG. 5 can be obtained (has sufficient selectivity) without eroding other portions, such as the sealing resin, the metal posts (of, for example, Cu), a silicon nitride film, or the like.

As an example, when the scribe line width is about 80 µm, the width of the half-cut groove 70 is preferably made about 60 µm, the etching amount (converted into a Si (100) face etching rate) is preferably made about 1 to 10 µm, and the width of the full-cut groove 72 (see FIG. 8J) is preferably made about 40 µm. In such a case, the profile of the bottom portion and the side portions of the half-cut explained with reference to FIG. 4 and FIG. 5 can then be realized after dicing (full-cutting).

Figure 8F:
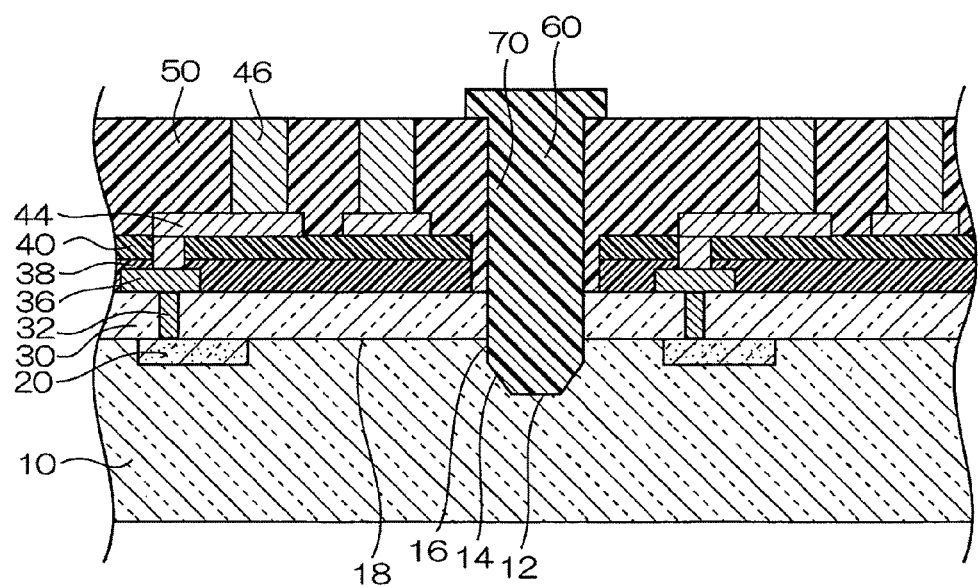

Then, as shown in FIG. 8F, the second sealing resin 60 is formed in the half-cut groove 70 that has been subjected to etching (step S35). The method therefor is preferably a production method that does not apply a large amount of pressure to the silicon substrate, such as, for example, screen printing, a dispensing method, a spin coating method, a spray coating method or the like. FIG. 8F illustrates an example of a case where screen printing is employed.

Figure 8G:
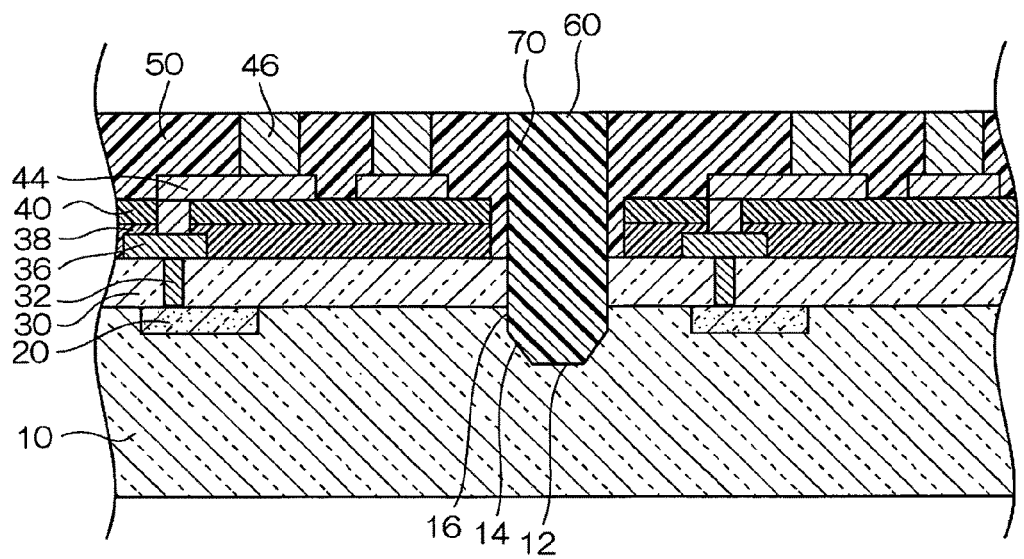

Then, as shown in FIG. 8G, finishing is performed to the desired the resin thickness by resin grinding for a second time (step S41). Unwanted resin from the second sealing resin 60, other than that filled in the half-cut groove 70, is ground away at this stage.

Figure 8H:
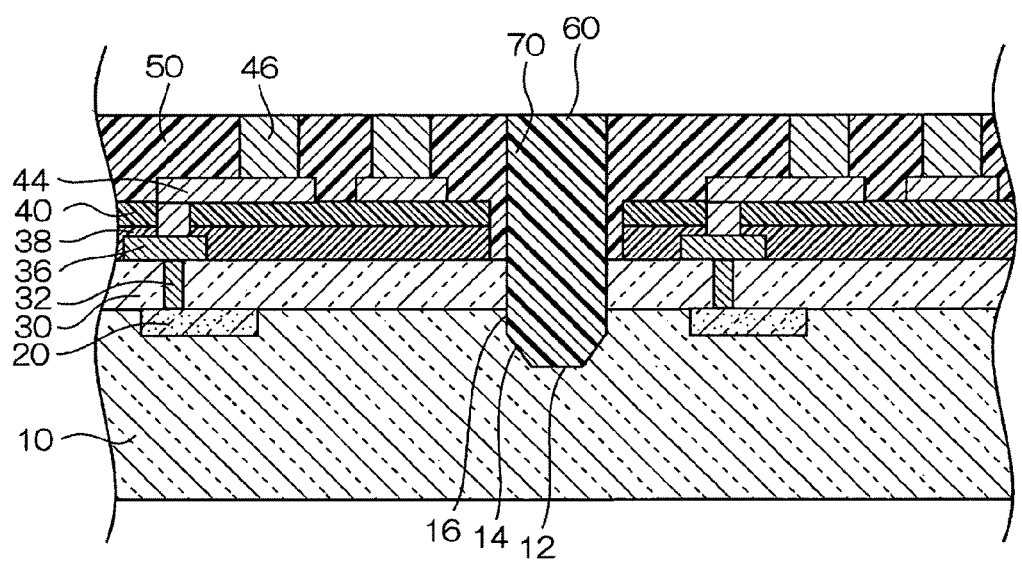
Figure 8:
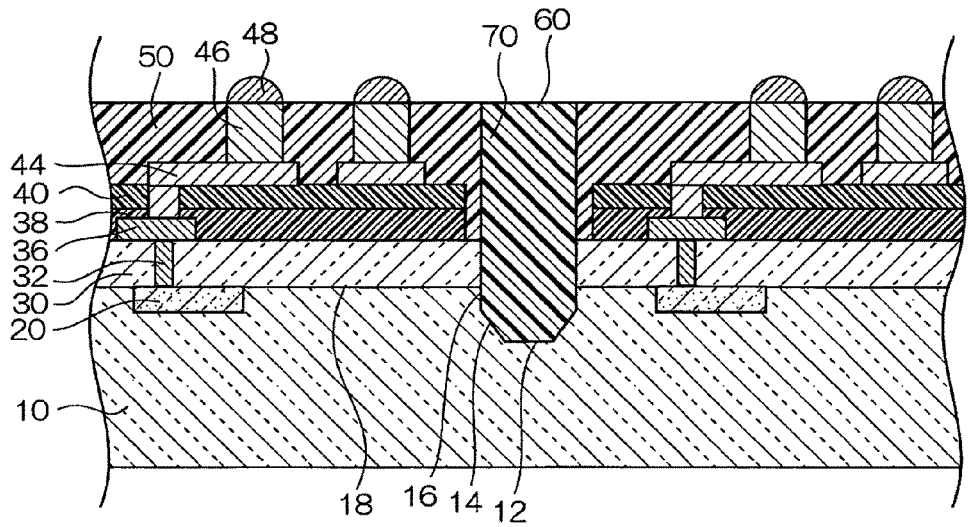

Then, as shown in FIG. 8H, grinding of the silicon substrate 10 is performed, and the thickness of the silicon substrate 10 is finished to the desired thickness (step S42).

Figure 8J:
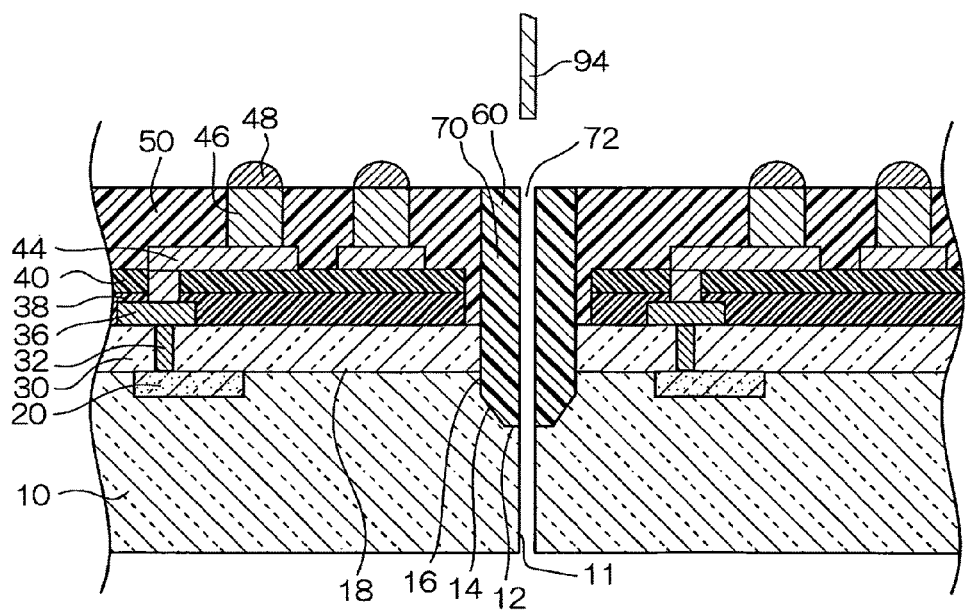

Next, as shown in FIG. 8I, the solder terminals 48 are formed on the metal posts 46 (step S43). Then, as shown in FIG. 8J, the dicing blade 94 is employed to form the dicing groove 72, and the semiconductor device is diced (full-cut) into individual chips (step S44). Accordingly, the packaging of the semiconductor device is completed thereby.

In the present exemplary embodiment described above, the profile of the bottom portion of the half-cut groove 70 is made from the conventional profile of FIG. 16 into the profile of FIG. 4. Accordingly, stress that accumulates in the bottom portion of the half-cut groove 70 can be dissipated. Further, in the present exemplary embodiment, the profile of the bottom portion of the half-cut groove 70 is made from the complete rectangular profile of FIG. 15 (process face angle 90°) into an obtuse angle greater than 90° (about 125° in the present exemplary embodiment), as shown in FIG. 4. Accordingly, the maximum stress can be even further dissipated. In addition, in the present exemplary embodiment, since the processed face 16 is moved to the inside by etching, the grip region in the Si (110) direction is enlarged, and the second sealing resin 60 formed on the grip region is profiled into an anchor profile under cutting the silicon substrate 10. Consequently, in the present exemplary embodiment, the adhesiveness between the second sealing resin 60 and the silicon substrate 10 can be enhanced, due to the anchor effect.

Furthermore, due to the etching processing for realizing the configuration of the present exemplary embodiment, defects and fine cracks introduced into the silicon substrate 10, when forming the half-cut groove 70, can be removed by etching. Accordingly, in the present exemplary embodiment, it is possible to significantly strengthen the semiconductor device with the inherent mechanical strength of the silicon substrate 10 itself.

Figure 9:
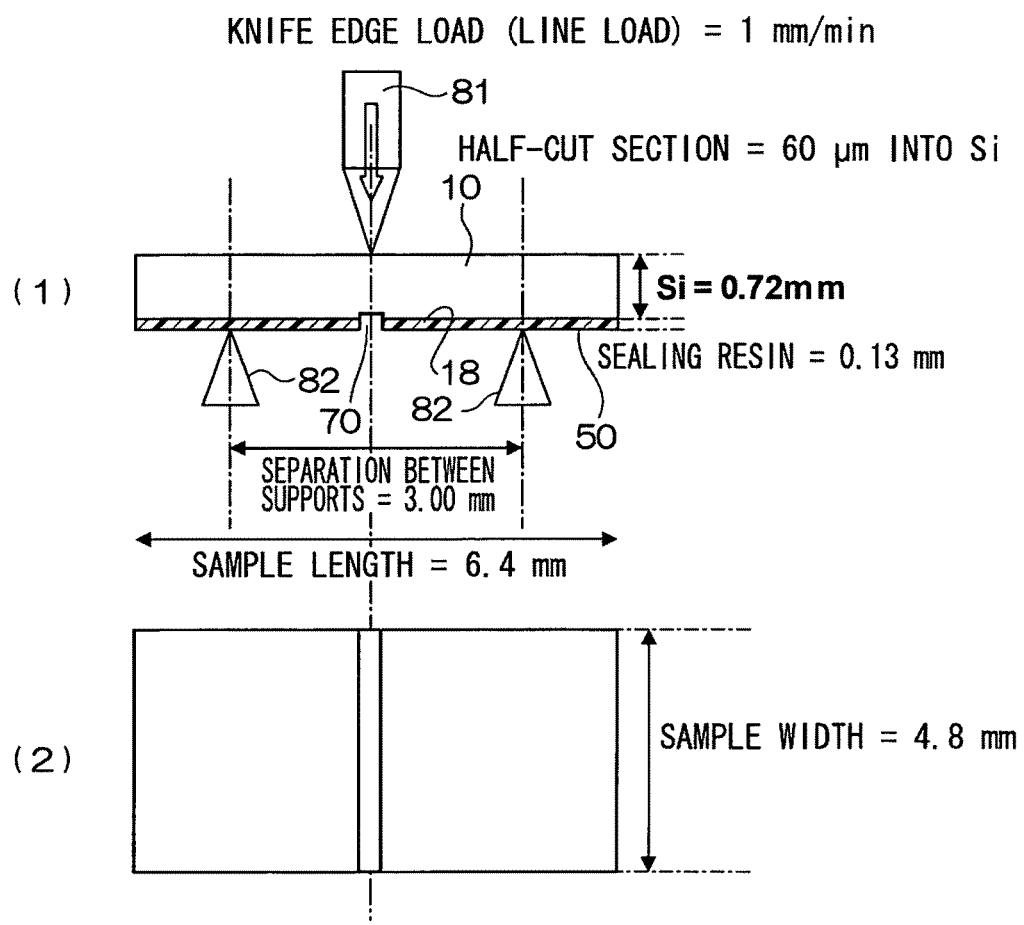
FIG. 9 is a schematic vertical cross-section and a schematic plan view, respectively, for explaining a method of measurement of the deflection strength of a construction according to an exemplary embodiment of the present invention and a conventional construction.
Figure 10:
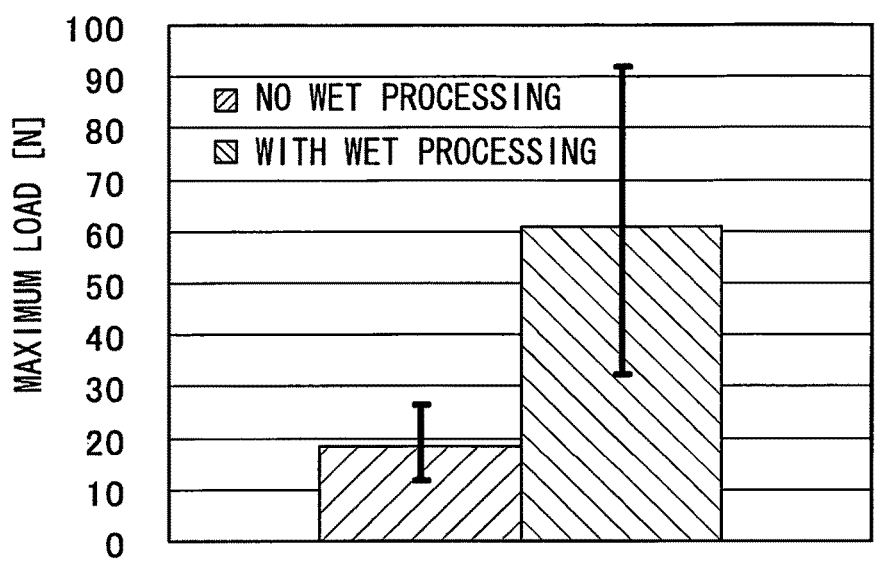
FIG. 10 is a graph showing the maximum load in deflection strength evaluation of a construction according to an exemplary embodiment of the present invention and a conventional construction.
Figure 11:
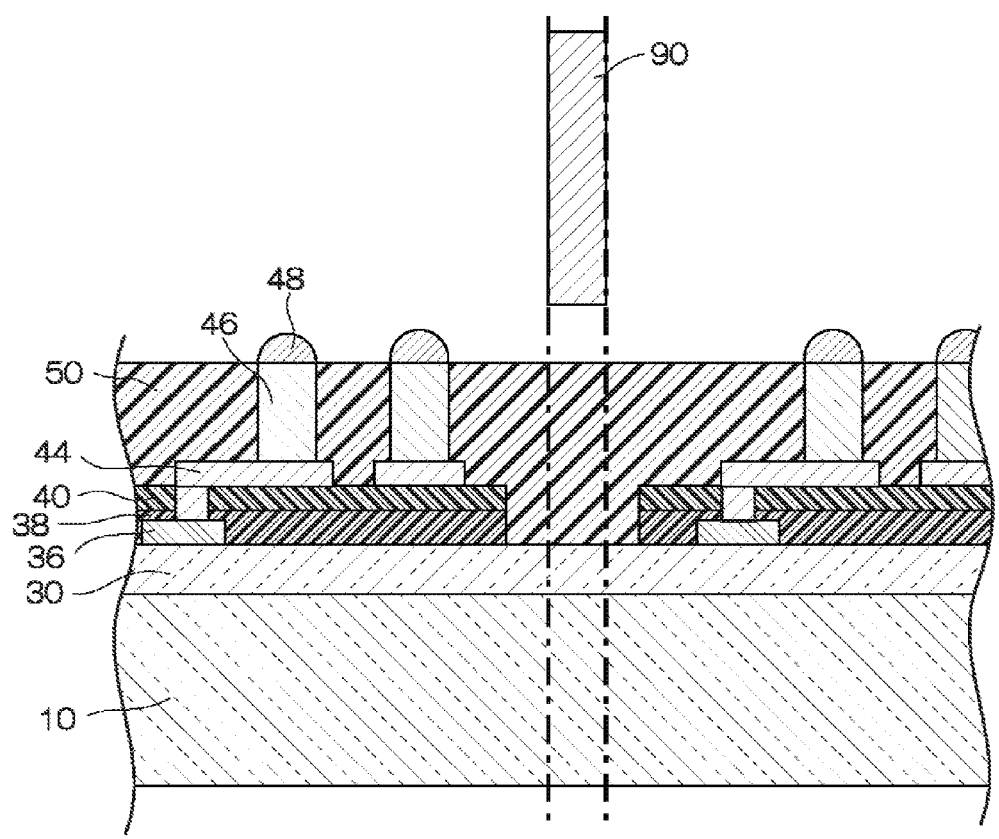
FIG. 11 is a schematic vertical cross-section for explaining a manufacturing method of a conventional semiconductor device.
Figure 12:
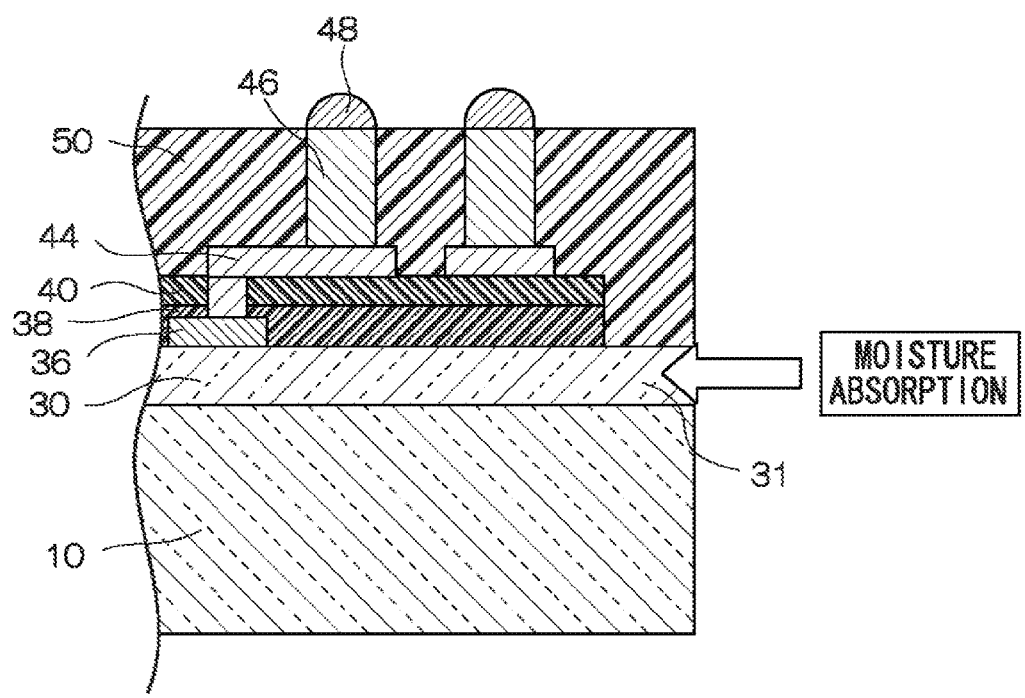
FIG. 12 is a schematic vertical cross-section for explaining a semiconductor device produced by a manufacturing method of the conventional semiconductor device shown in FIG. 11.
Figure 13:
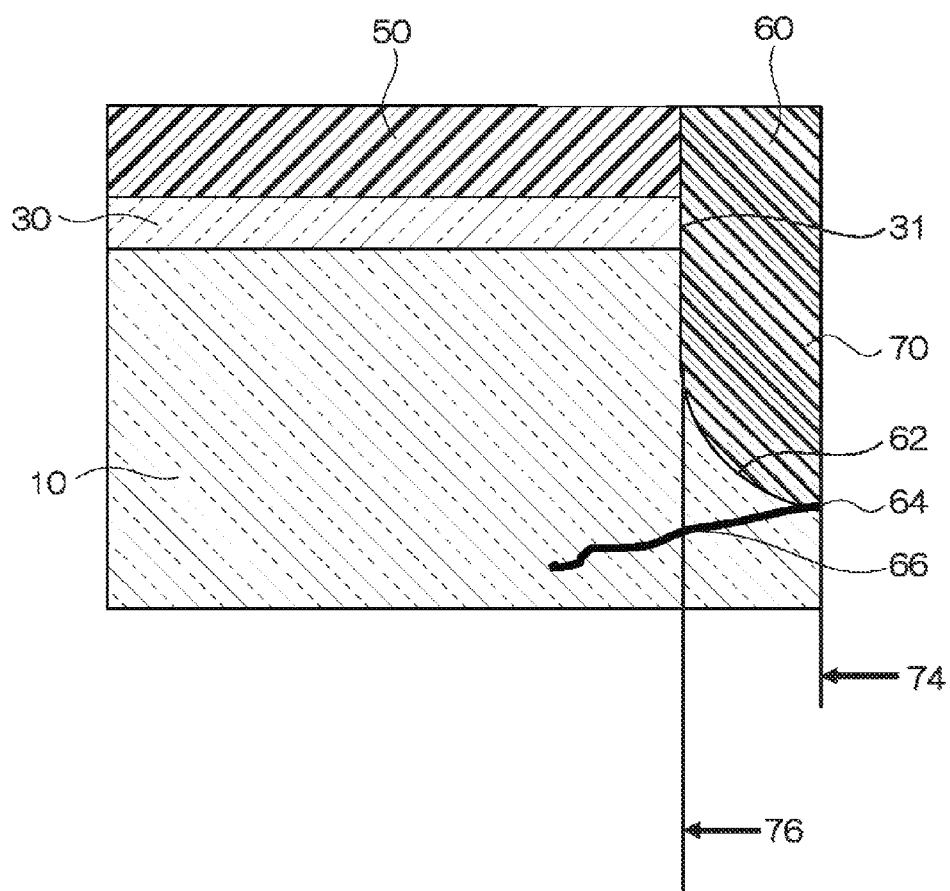
FIG. 13 is a schematic vertical cross-section for explaining a semiconductor device produced by a conventional semiconductor device manufacturing method.
Figure 14:
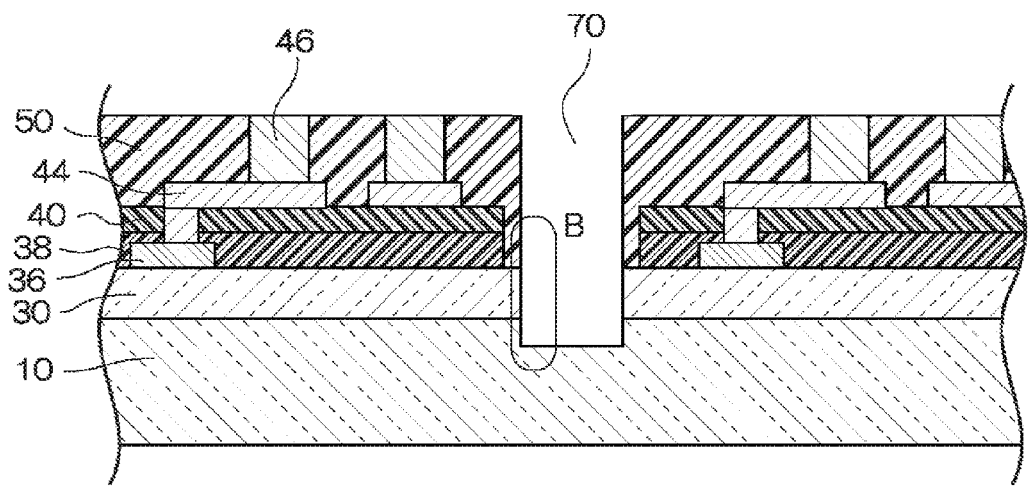
FIG. 14 is a schematic vertical cross-section for explaining a conventional structure and manufacturing method of a semiconductor device.

In order to confirm raised strength, FIG. 10 shows comparative results of the mechanical strength (deflection strength) of a conventional structure in which the half-cut groove 70 was formed using the dicing blade 92 but not then subjected to etching processing, and a structure of the present exemplary embodiment in which the half-cut groove 70 was formed with the dicing blade 92 and then subjected to etching processing. It is confirmed that the structure of the present exemplary embodiment has 3 times the strength of the conventional structure or greater. As a result of this, the mechanical strength of the silicon substrate 10 is greatly raised, and cracks in the silicon substrate 10 can be suppressed even under conditions in which thermal cycling is applied after packaging. Note that, as shown in FIG. 9, measurement of the deflection strength for a sample of conventional structure is at the center of the sealing resin 50 of 0.13 mm thickness formed on the main face 18 of the silicon substrate 10 of length 6.4 mm, width 4.8 mm, and thickness 0.72 mm, in which the half-cut groove 70 has been formed by employing the dicing blade 92. In contrast, the above is also subjected to etching processing as a sample of the present exemplary embodiment. Note that, the depth of the half-cut groove 70 with respect to the silicon substrate is 60 µm, and the width of the half-cut groove 70 is 60 µm.

Measurements on the samples produced in this manner were made with the side on which the sealing resin 50 was formed placed downwards, the samples supported at two support points 82 with a separation between supports of 3.00 mm, measured with a downwards movement speed of 1 mm/min for a knife-edge load 81 applying a line load.

What is claimed is:

1. A semiconductor device comprising:
   a single crystal semiconductor substrate having a main face that has semiconductor elements, a side face intersecting with the main face, and a first face intersecting with a second face at an obtuse angle, wherein the second face intersects with the side face; and
   a first insulator provided to cover at least a portion of the side face, a portion of the first face, and a portion of the second face;
   wherein the first face is a face with a plane direction forming an angle of between −5° and +5° to the plane direction of the main face.

2. The semiconductor device of claim 1, wherein the first face is a face with a plane direction forming an angle of between −3.5° and +3.5° to the plane direction of the main face.

3. The semiconductor device of claim 1, wherein the first face is a face with a plane direction that is the same as the plane direction of the main face.

4. The semiconductor device of claim 1, further comprising a second insulator provided above the main face, wherein:
   the line of intersection of the side face with the main face is disposed further to the inside than an edge of the second insulator; and
   a portion of the first insulator extends out further to the inside than the edge of the second insulator.

5. The semiconductor device of claim 4, wherein the second insulator is an interlayer insulating film.

6. The semiconductor device of claim 4, wherein the second insulator is a sealing resin.

7. The semiconductor device of claim 4, wherein the second insulator is an interlayer insulating film, and the semiconductor device further comprises a sealing resin provided above the interlayer insulating film.

8. The semiconductor device of claim 1, wherein the first insulator is a sealing resin.

9. The semiconductor device of claim 6, wherein the first insulator is a sealing resin different from the sealing resin of the second insulator.

10. The semiconductor device of claim 1, wherein the main face is a (100) face, and the first face is a (100) face.

11. The semiconductor device of claim 1, wherein the main face is a (100) face, the first face is a (100) face, and the second face is a (111) face.

12. The semiconductor device of claim 4, wherein the main face is a (100) face, the first face is a (100) face, and the third face is a (110) face.

13. The semiconductor device of claim 1, wherein the main face is a (110) face and the first face is a (110) face.

14. The semiconductor device of claim 1, wherein the single crystal semiconductor substrate is either a single crystal semiconductor substrate of diamond structure, or a compound single crystal semiconductor substrate of zincblende structure.

15. The semiconductor device of claim 1, further comprising:
   metal redistribution lines provided on the main face, and electrically connected to the semiconductor elements; and
   external connection terminals connected to the metal redistribution lines.

16. The semiconductor device of claim 1, wherein the semiconductor device is a wafer level chip size package.

17. A semiconductor device comprising:
   a single crystal semiconductor substrate having a main face that has semiconductor elements, and a side face intersecting with the main face;
   a first insulator provided to cover at least a portion of the side face: and
   a second insulator provided above the main face;
   wherein the side face covered by the first insulator includes a first face with a plane direction forming an angle of between −5° and +5° to the plane direction of the main face;
   wherein the side face covered by the first insulator further comprises a third face disposed to the inside of the first face and intersecting with the main face;
   wherein the line of intersection of the third face with the main face is disposed further to the inside than an edge of the second insulator; and
   wherein a portion of the first insulator extends out further to the inside than the edge of the second insulator.

18. The semiconductor device of claim 17, wherein the second insulator is an interlayer insulating film, and the semiconductor device further comprises a sealing resin provided above the interlayer insulating film.

19. The semiconductor device of claim 18, wherein the first insulator is a sealing resin different from the sealing resin of the second insulator.

20. The semiconductor device of claim 17, further comprising:
   metal redistribution lines provided on the main face, and electrically connected to the semiconductor elements; and
   external connection terminals connected to the metal redistribution lines.

* * * * *